United States Patent
Chen et al.

(10) Patent No.: US 12,426,297 B2
(45) Date of Patent: Sep. 23, 2025

(54) METHOD AND STRUCTURE FOR AIR GAP INNER SPACER IN GATE-ALL-AROUND DEVICES

(71) Applicant: Taiwan Semiconductor Manufacturing Co., Ltd., Hsin-Chu (TW)

(72) Inventors: Shih-Chiang Chen, Taichung (TW); Wei-Yang Lee, Taipei (TW); Chia-Pin Lin, Hsinchu County (TW); Yuan-Ching Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/395,892

(22) Filed: Dec. 26, 2023

(65) Prior Publication Data
US 2024/0128376 A1    Apr. 18, 2024

Related U.S. Application Data

(60) Continuation of application No. 17/850,036, filed on Jun. 27, 2022, now Pat. No. 11,855,220, which is a
(Continued)

(51) Int. Cl.
*H10D 30/62* (2025.01)
*H10D 30/01* (2025.01)
(Continued)

(52) U.S. Cl.
CPC ....... *H10D 30/6211* (2025.01); *H10D 30/024* (2025.01); *H10D 30/6735* (2025.01);
(Continued)

(58) Field of Classification Search
CPC ........... H01L 29/42392; H01L 29/4991; H01L 21/823481; H01L 21/823878;
(Continued)

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

TW    202002025 A    1/2020

OTHER PUBLICATIONS

Yu, Jia-Ni, et al., "P-Metal Gate First Gate Replacement Process for Multigate Devices", U.S. Appl. No. 16/834,637, filed Mar. 30, 2020, 43 pages of specification, 24 pages of drawings.
(Continued)

*Primary Examiner* — Sonya McCall-Shepard
(74) *Attorney, Agent, or Firm* — HAYNES AND BOONE, LLP

(57) ABSTRACT

A device a includes a substrate, two source/drain (S/D) features over the substrate, and semiconductor layers suspended over the substrate and connecting the two S/D features. The device further includes a dielectric layer disposed between two adjacent layers of the semiconductor layers and an air gap between the dielectric layer and one of the S/D features, where a ratio between a length of the air gap to a thickness of the first dielectric layer is in a range of 0.1 to 1.0.

20 Claims, 13 Drawing Sheets

Related U.S. Application Data division of application No. 16/945,394, filed on Jul. 31, 2020, now Pat. No. 11,374,128.

(60) Provisional application No. 62/982,395, filed on Feb. 27, 2020.

(51) Int. Cl.

| | |
|---|---|
| *H10D 30/67* | (2025.01) |
| *H10D 62/10* | (2025.01) |
| *H10D 62/13* | (2025.01) |
| *H10D 64/01* | (2025.01) |
| *H10D 64/66* | (2025.01) |
| *H10D 84/01* | (2025.01) |
| *H10D 84/03* | (2025.01) |
| *H10D 84/83* | (2025.01) |
| *H10D 84/85* | (2025.01) |

(52) U.S. Cl.
CPC ....... *H10D 30/6757* (2025.01); *H10D 62/151* (2025.01); *H10D 64/679* (2025.01); *H10D 84/013* (2025.01); *H10D 84/0158* (2025.01); *H10D 84/038* (2025.01); *H10D 84/834* (2025.01)

(58) Field of Classification Search
CPC ........ H01L 21/823418; H10D 30/6735; H10D 64/679; H10D 84/0151; H10D 84/0188; H10D 84/013
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 9,093,514 B2 | 7/2015 | Tsai et al. |
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,576,814 B2 | 2/2017 | Wu et al. |
| 2017/0194430 A1* | 7/2017 | Wood ................. H10D 62/119 |
| 2017/0250261 A1 | 8/2017 | Kim et al. |
| 2018/0053837 A1 | 2/2018 | Bi |
| 2019/0157414 A1 | 5/2019 | Ando et al. |
| 2019/0157444 A1 | 5/2019 | Yang |
| 2020/0335602 A1 | 10/2020 | Chu |

OTHER PUBLICATIONS

Huang, Mao-Lin et al., "Gate Patterning Process for Multi-Gate Devices", U.S. Appl. No. 16/858,440, filed Apr. 24, 2020, 31 pages of specification, 38 pages of drawings.

Huang, Wang-Chun et al., "Semiconductor Devices with Improved Capacitors", U.S. Appl. No. 16/802,396, filed Feb. 26, 2020, 30 pages of specification, 29 pages of drawings.

* cited by examiner

METHOD AND STRUCTURE FOR AIR GAP INNER SPACER IN GATE-ALL-AROUND DEVICES

PRIORITY

This is a Continuation application of U.S. application Ser. No. 17/850,036 filed Jun. 27, 2022, which is a divisional application of U.S. application Ser. No. 16/945,394 filed Jul. 31, 2020, issued on Jun. 28, 2022, as U.S. Pat. No. 11,374,128, which claims the benefits of and priority to U.S. Provisional Application No. 62/982,395, filed Feb. 27, 2020, each of which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all-around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen when reducing the parasitic capacitance of gate electrodes and source/drain (S/D) features. Accordingly, although existing GAA devices and methods for fabricating the same have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
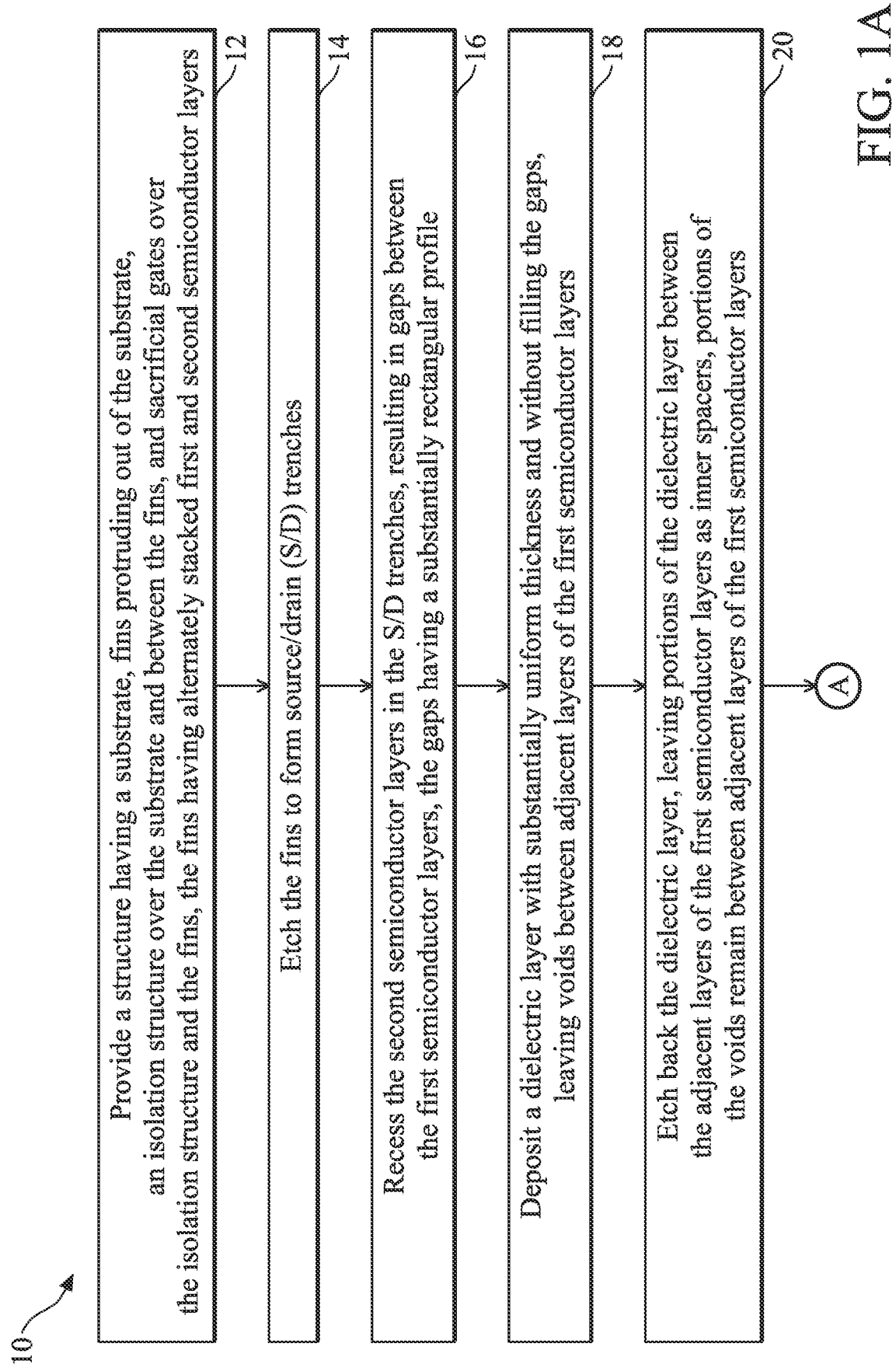
FIG. 1A and FIG. 1B are a flow chart of a method for fabricating a multi-gate device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This present disclosure relates generally to semiconductor devices and their manufacturing methods, and more particularly to inner spacer formation in gate-all-around (GAA) devices, such as nano sheet devices or nanowire devices. The inner spacer is provided between source/drain (S/D) epitaxial (EPI) features and high-k metal gates (HKMG). Thus, the material of the inner spacer affects the parasitic capacitance between the S/D EPI and HKMG. Embodiments of the present disclosure provide a process of forming inner spacers with voids, thereby reducing the parasitic capacitance between the S/D EPI and HKMG. Further, the inner spacer functions as a protective layer for the S/D EPI during channel release processes.

Figure 1B:
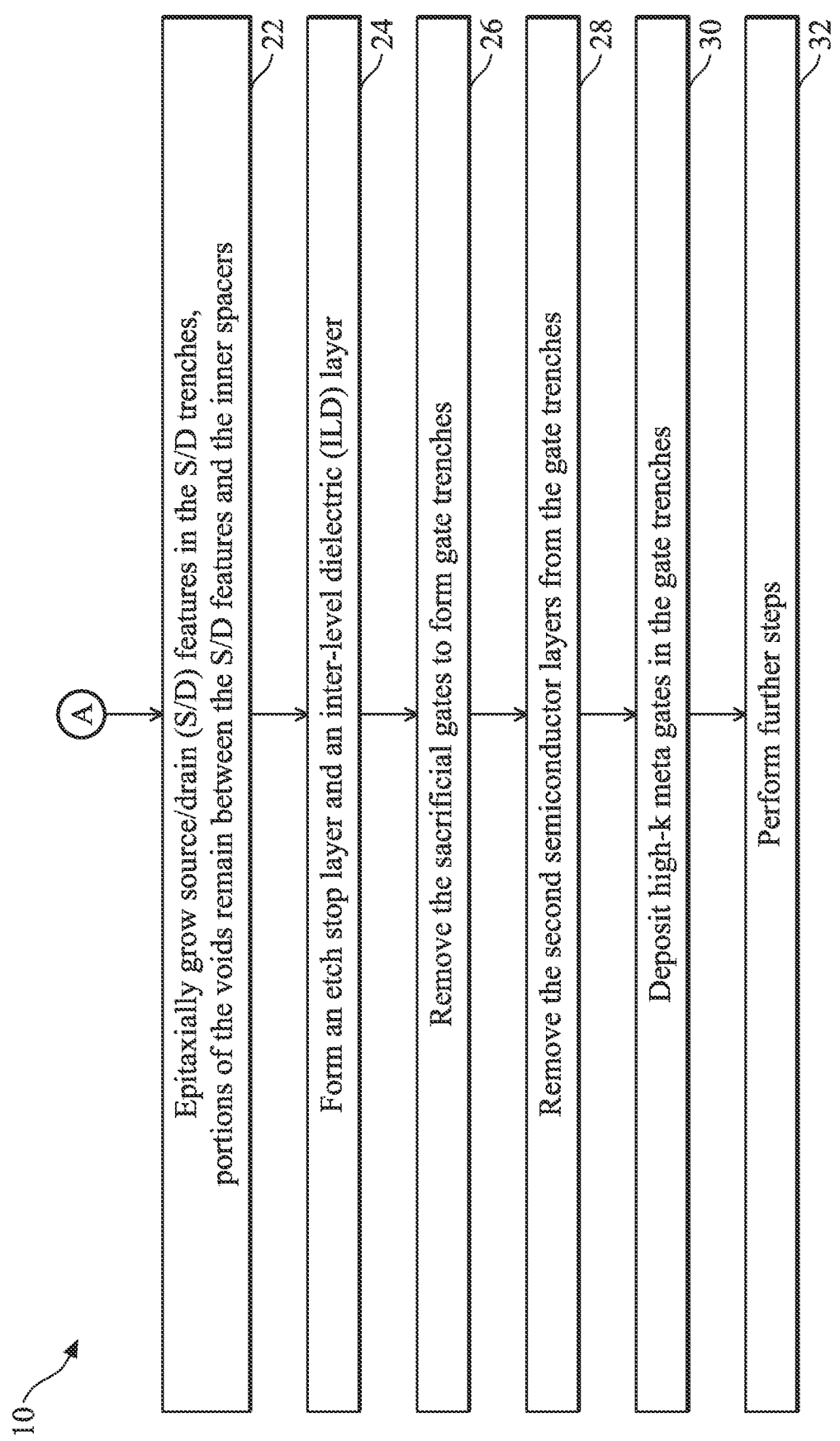
Figure 2A:
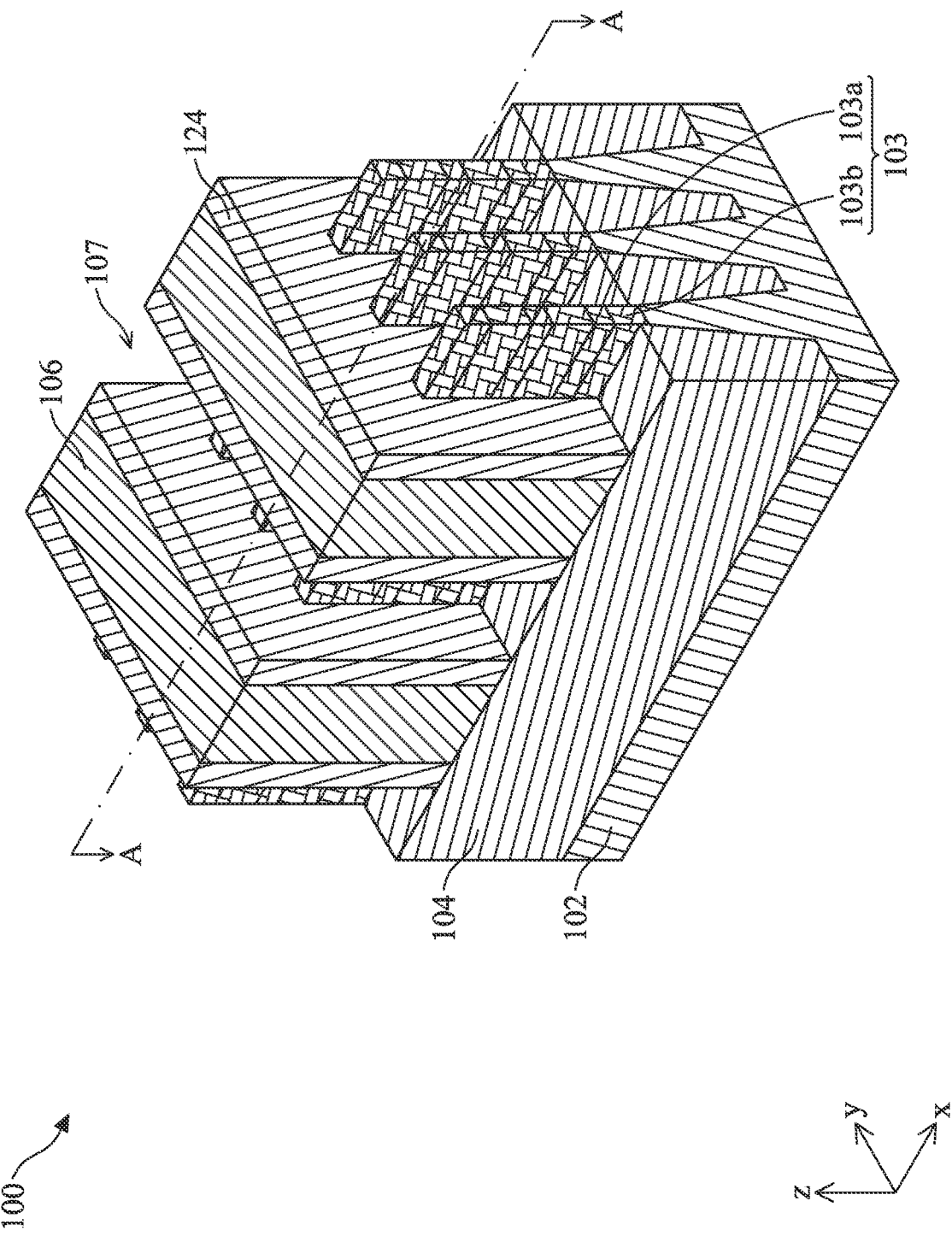
FIG. 2A is a diagrammatic perspective view of a multi-gate device, in portion, at a fabrication stage of the method in FIG. 1A and FIG. 1B, according to various aspects of the present disclosure.

FIG. 1A and FIG. 1B are a flow chart of a method 10 for fabricating a multi-gate device 100 according to various aspects of the present disclosure. In some embodiments, the multi-gate device 100 includes GAA transistors. FIG. 2A is a diagrammatic perspective view of the multi-gate device 100, in portion, at a fabrication stage of the method 10, according to some aspects of the present disclosure. FIGS. 2B, 3, 4, 5, 6, 7, 8, 9, 10, and 11 are diagrammatic cross-sectional views of the multi-gate device 100 along the A-A line of FIG. 2A, in portion, at various fabrication stages associated with the method 10, according to aspects of the present disclosure. The method 10 includes operations 12, 14, 16, 18, 20, 22, 24, 26, 28, 30, and 32. Additional processing is contemplated by the present disclosure. Additional operations can be provided before, during, and after the method 10, and some of the operations described can be moved, replaced, or eliminated for additional embodiments of the method 10.

The multi-gate device 100 may be included in a microprocessor, a memory, and/or other IC device. In some embodiments, the multi-gate device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), FinFET, nanosheet FETs, nanowire FETs, other types of multi-gate FETs, complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the multi-gate device 100 is included in memory devices, such as static random access memory (SRAM), non-volatile random access memory (NVRAM), flash memory, an electrically erasable programmable read only memory (EEPROM), an electrically programmable read-only memory (EPROM), other suitable memory type, or combinations thereof. FIGS. 2A-11 have been simplified for the sake of clarity to better understand the inventive concepts of the present disclosure. Additional features can be added in the multi-gate device 100, and some of the features described below can be replaced, modified, or eliminated in other embodiments of the multi-gate device 100. The fabrication of the device 100 is described below in conjunction with embodiments of the method 10.

Figure 2B:
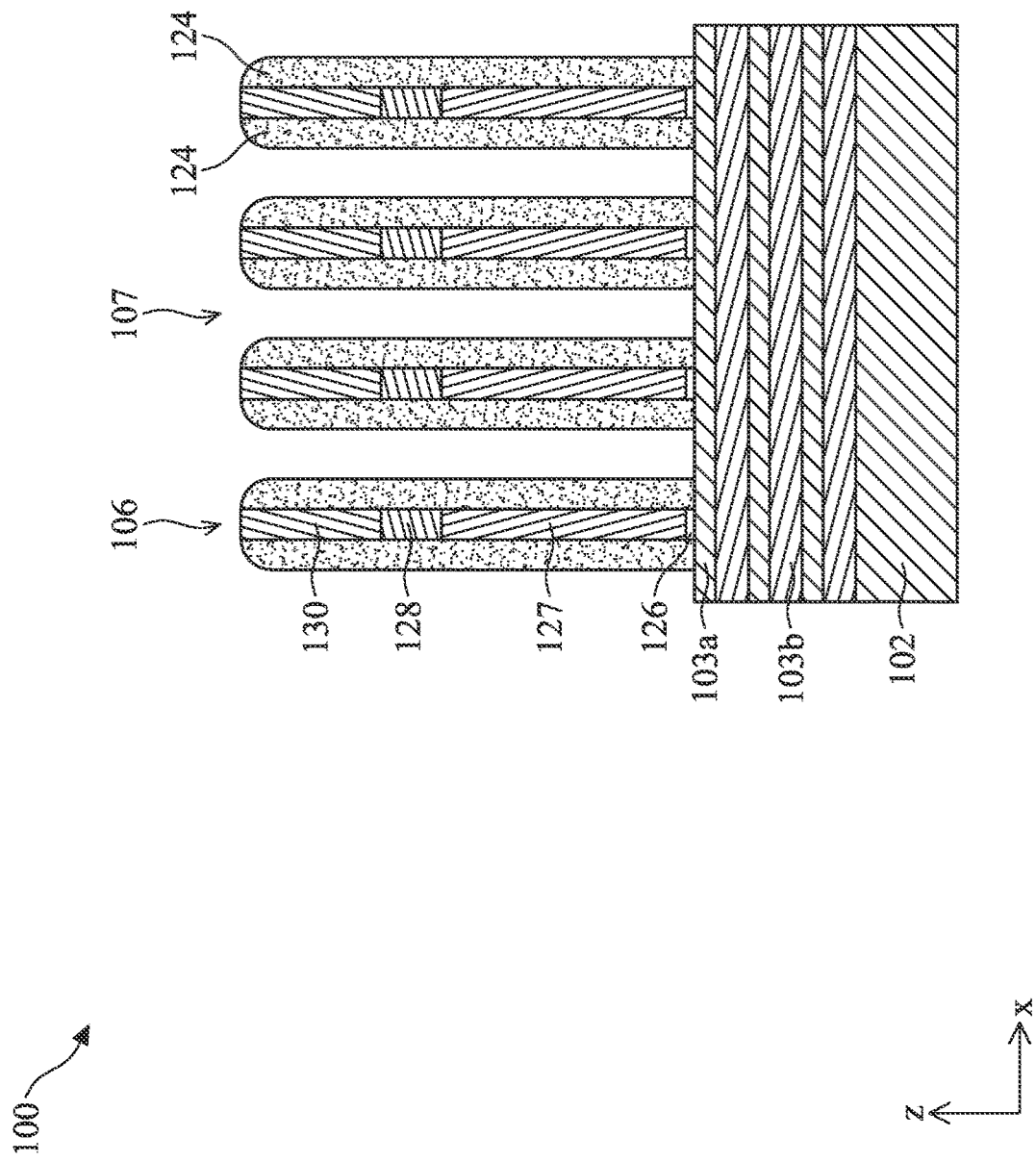
FIGS. 2B, 3, 4, 5, 6, 7, 8, 9, 10, and 11 are diagrammatic cross-sectional views of a multi-gate device, in portion, at various fabrication stages associated with the method in FIG. 1A and FIG. 1B, according to various aspects of the present disclosure.

At operation 12, the method 10 (FIG. 1A) provides an initial structure of the device 100. Turning to FIGS. 2A-2B, the device 100 includes a substrate 102, fins 103 extending from the substrate 102, isolation structure 104 over the substrate 102 and between lower portions of the fins 103, sacrificial gate stacks 106 over the fins 103 and the isolation structure 104, and gate spacers 124 on sidewalls of the sacrificial gate stacks 106. Each sacrificial gate stack 106 includes a sacrificial gate dielectric layer 126, a sacrificial gate electrode layer 127, and hard mask layers 128 and 130. Each of the fins 103 includes a stack of semiconductor layers 103a and 103b. The S/D regions of the fins 103 are exposed in trenches 107 between the sacrificial gate stacks 106. The various components of the device 100 are further described below.

In the present embodiment, the substrate 102 includes silicon. For example, it is a silicon wafer. Alternatively or additionally, substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions depending on design requirements of the device 100. For example, the substrate 102 may include p-type doped regions configured for n-type GAA transistors and n-type doped regions configured for p-type GAA transistors. P-type doped regions are doped with p-type dopants, such as boron, indium, other p-type dopant, or combinations thereof. N-type doped regions are doped with n-type dopants, such as phosphorus, arsenic, other n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or other suitable doping process can be performed to form the various doped regions.

Each of the fins 103 includes semiconductor layers 103a and semiconductor layers 103b stacked vertically (e.g., along the z-direction) in an interleaving or alternating configuration from a surface of the substrate 102. In some embodiments, the semiconductor layers 103a and the semiconductor layers 103b are epitaxially grown in the depicted interleaving and alternating configuration, layer-by-layer, until a desired number of semiconductor layers is reached. In the depicted embodiment, each fin 103 includes three semiconductor layers 103a and three semiconductor layers 103b. However, the present disclosure contemplates embodiments where each fin 103 includes more or less semiconductor layers, for example, depending on a number of channels desired for the device 100. For example, each fin 103 may include two to ten semiconductor layers 103a and two to ten semiconductor layers 103b in some embodiments. A composition of the semiconductor layers 103a is different than a composition of the semiconductor layers 103b to achieve etching selectivity and/or different oxidation rates during subsequent processing. For example, the semiconductor layers 103a and 103b may include different materials, different constituent atomic percentages, different constituent weight percentages, and/or other different characteristics to achieve desired etching selectivity during an etching process, such as an etching process implemented to form suspended channel layers in channel regions of the device 100. In the present embodiment, the semiconductor layers 103a include silicon and the semiconductor layers 103b include silicon germanium, which has a different etch selectivity than silicon. In some embodiments, the semiconductor layers 103a and 103b can include the same material but with different constituent atomic percentages to achieve the etching selectivity and/or different oxidation rates. For example, the semiconductor layers 103a and 103b can include silicon germanium, where the semiconductor layers 103a have a first silicon atomic percent and/or a first germanium atomic percent and the semiconductor layers 103b have a second, different silicon atomic percent and/or a second, different germanium atomic percent. The present disclosure contemplates that the semiconductor layers 103a and 103b include any combination of semiconductor materials that can provide desired etching selectivity, desired oxidation rate differences, and/or desired performance characteristics (e.g., materials that maximize current flow), including any of the semiconductor materials disclosed herein. In some embodiments, thickness of each semiconductor layer 103a is about 1 nm to about 10 nm, thickness of each semiconductor layer 103b is about 1 nm to about 10 nm, and the two thicknesses can be the same or different.

The fins 103 may be patterned from a stack of semiconductor layers (103a and 103b) by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The isolation structure 104 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 104 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 104. Other types of isolation structure may also be suitable, such as field oxide and LOCal Oxidation of Silicon (LOCOS). The isolation structure 104 may include a multi-layer structure, for example, having one or more liner layers (e.g., silicon nitride) on surfaces of the substrate 102 and the fins 103 and a main isolating layer (e.g., silicon dioxide) over the one or more liner layers.

The sacrificial gate dielectric layer 126 may include a dielectric material such as silicon oxide (e.g., $SiO_2$) or silicon oxynitride (e.g., SiON), and may be formed by chemical oxidation, thermal oxidation, atomic layer deposition (ALD), CVD, and/or other suitable methods. The sacrificial gate electrode layer 127 may include poly-crystalline silicon (poly-Si) or other material(s) and may be formed by suitable deposition processes such as low-pressure chemical vapor deposition (LPCVD) and plasma-enhanced CVD (PECVD). The hard mask layer 128 may include silicon nitride or other suitable dielectric material and may be formed by CVD or other suitable methods. The hard mask layer 130 may include silicon oxide or other suitable dielectric material and may be formed by CVD or other suitable methods. The various layers 126, 127, 128, and 130 may be patterned by photolithography and etching processes. The gate spacers 124 may comprise a dielectric material, such as silicon oxide, silicon nitride, silicon oxynitride, silicon carbide, other dielectric material, or combinations thereof, and may comprise one or multiple layers of material. The gate spacers 124 may be formed by depositing a spacer material as a blanket over the isolation structure 104, the fins 103, and the sacrificial gate stacks 106. Then the spacer material is etched by an anisotropic etching process to expose the isolation structure 104, the hard mask layer 130, and a top surface of the fins 103. Portions of the spacer material on the sidewalls of the sacrificial gate stacks 106 become the gate spacers 124. Adjacent gate spacers 124 provide openings 107 that expose portions of the fins 103 in the S/D regions of the device 100.

Figure 3:
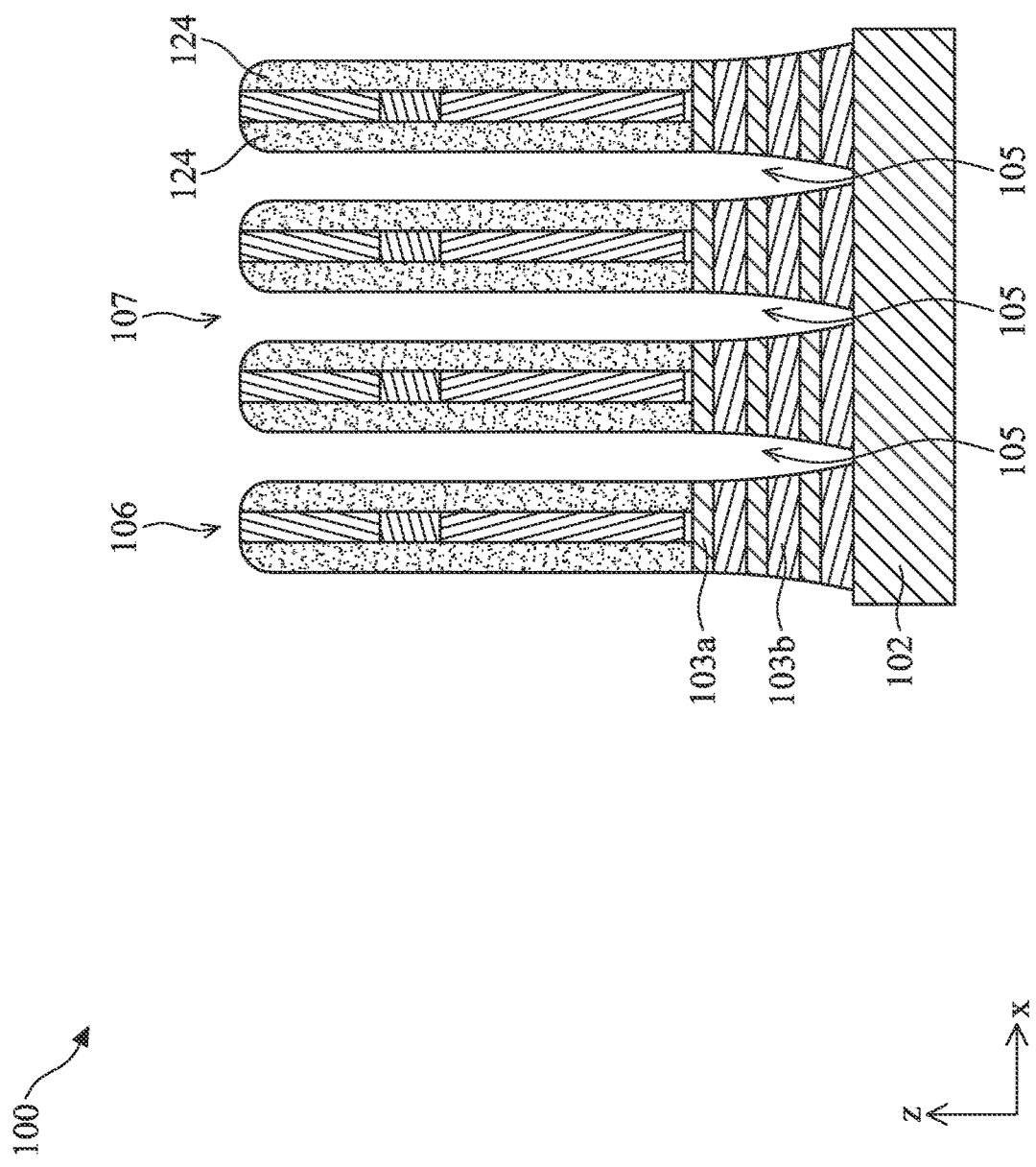

At operation 14, the method 10 (FIG. 1A) etches the fins 103 to form S/D trenches 105 (FIG. 3). Operation 14 may include one or more photolithography process and etching processes. For example, the photolithography process may form a masking element covering areas of the device 100 that are not to be etched. The masking element provides openings through which the fins 103 are etched. In an embodiment, the etching process may include dry etching, wet etching, reactive ion etching (RIE), and/or other suitable processes, as discussed earlier. Further, the etching process is tuned selective to the materials of the fins 103, and with no (or minimal) etching to the gate spacers 124, the hard mask layer 130, and the isolation structure 104. As a result of the etching process, various surfaces of the semiconductor layers 103a and 103b are exposed in each S/D trench 105.

Figure 4:
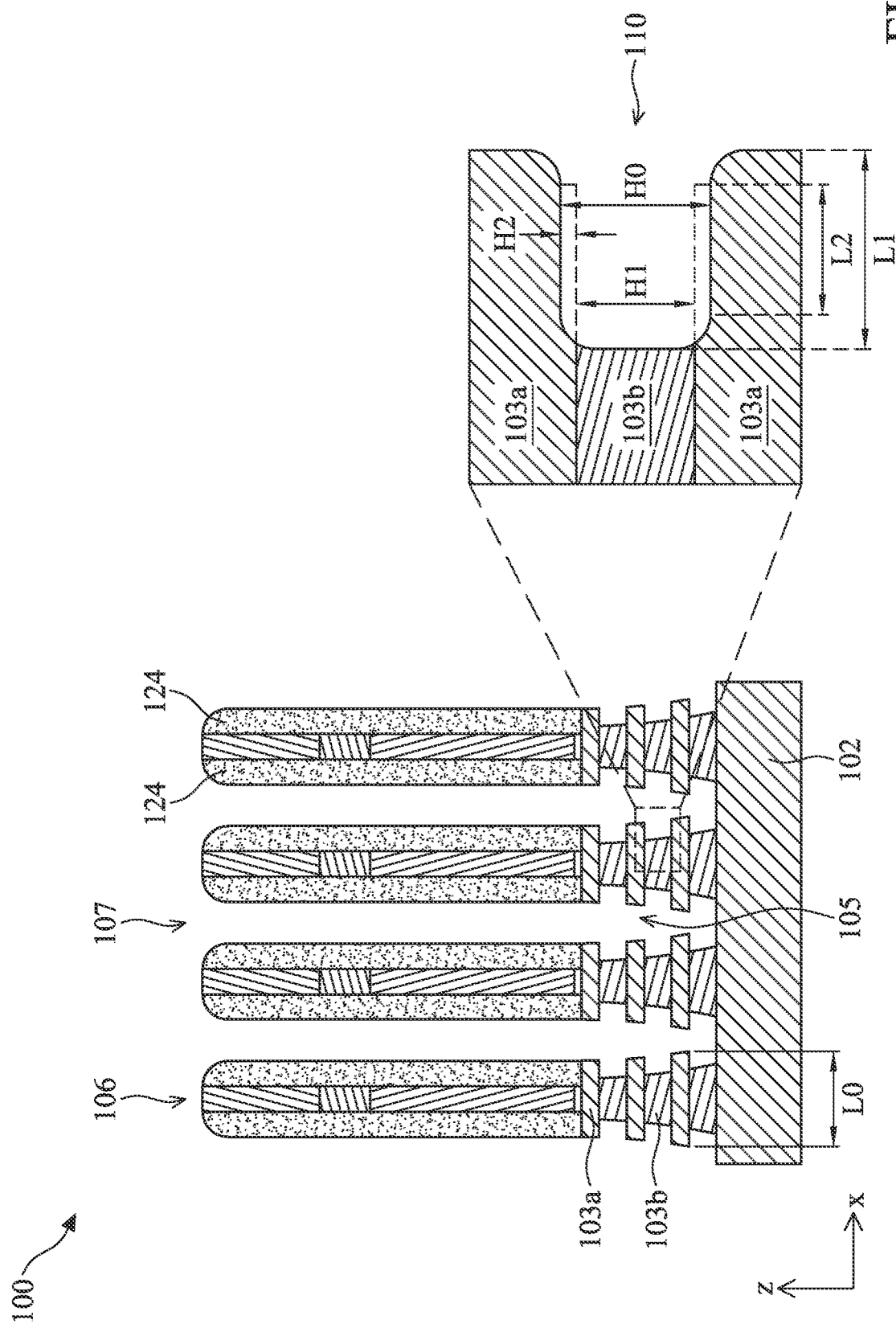

At operation 16, the method 10 (FIG. 1A) recesses the semiconductor layers 103b within the S/D trench 105, thereby creating gaps 110 between every two adjacent semiconductor layers 103a and between the bottommost semiconductor layer 103a and the substrate 102, such as shown in FIG. 4. Particularly, the right side of FIG. 4 illustrates (in a blow-up view) one of the gaps 110 that is surrounded on three sides by the semiconductor layers 103a and 103b. The top and bottom sides of the gap 110 are surfaces of the semiconductor layer 103a, and the left side of the gap 110 (or the right side of some other gaps 110) is a surface of the semiconductor layer 103b. In the present embodiment, the gaps 110 are designed to have a rectangular or substantially rectangular profile, which assists in creating voids sandwiched by inner spacers as will be discussed later. In approaches where the profile of the gap 110 is not rectangular or not substantially rectangular (for example, it is trapezoidal, or funnel shaped), the gap 110 would be easily filled with inner spacers and leave no voids therein, which is undesirable per the present disclosure. As shown in FIG. 4, the gap 110 has a total length L1 (along the "x" direction). The two ends of the gap 110 may have slightly rounded corners. The middle section of the gap 110 (excluding the two ends) has a length L2 (along the "x" direction). The length L1 is selected based on the length L0 of the semiconductor layer 103a, the thickness H1 of the semiconductor layer 103b, the desired channel control by the gate (for example, the gate 135 in FIG. 11), and the acceptable coupling (or parasitic) capacitance between the gate and the S/D (for example, the S/D 108 in FIG. 11). In some embodiments, the length L1 is in a range of about 6.0 nm to about 10.0 nm. In some embodiments, a ratio of L1 to L0 (L1:L0) is in a range of about 0.05 to about 0.3. If the length L1 is too large (such as more than 10.0 nm) or the ratio of L1:L0 is too large (such as more than 0.3), a large portion of the semiconductor layer 103a is not wrapped around by the gate and the channel control by the gate may suffer from poor performance in some instances. If the length L1 is too small (such as less than 6.0 nm) or the ratio L1:L0 is too small (such as less than 0.05), the gate and S/D coupling capacitance may be undesirably high in some embodiments or the inner spacer (for example, the inner spacer 122 in FIG. 10) may be too thin to protect S/D from etching processes during gate replacement. In some embodiments, a ratio of L1:H1 is in a range of 1.0 to 2.0. If the ratio of L1:H1 is too small (such as less than 1.0), the gap 110 might be easily filled with inner spacers and leave no voids therein in some instances, which is undesirable per the present disclosure. If the ratio of L1:H1 is too large (such as greater than 2.0), the gap 110 may be so slim that inner spacers might not be deposited therein in some instances. In the middle section, the gap 110 is substantially rectangular, i.e., the upper and lower surfaces of the gap 110 (which are surfaces of the semiconductor layers 103a) in the middle section are substantially parallel to each other (e.g., within +/−5 degrees of variation). To the left side and the right side of the middle section, the gap 110 may have slightly rounded corners in some embodiments. In some embodiments where L1 is in a range of about 6.0 nm to 10.0 nm, the length L2 may be in a range of about 5.0 nm to 8.5 nm. In some embodiments, L2 is more than 50% of L1, such as about 50% to 90% of L1. If the ratio of L2 to L1 is too small (such as less than 50%), the gap 110 would be easily filled with inner spacers and leave no voids therein, which would undesirably increase the gate and S/D coupling capacitance in some embodiments. Further, the gap 110 has a height H0 in the middle section. The height H0 equals to (H1+2×H2), where H1 is the thickness of the semiconductor layer 103b, and H2 is the loss of thickness of the semiconductor layer 103a during the operation 16. In some embodiments, H1 is in a range of about 5.0 nm to 8.0 nm, and H2 is less than 1.5 nm, such as less than 1.0 nm. In some embodiments, a ratio of H0 to H1 is in a range of about 1.6 to 1.0. In approaches where H2 is more than 1.5 nm or the ratio of H0 to H1 is greater than 1.6, the profile of the gap 110 would be more like a trapezoid than a rectangle and the gap 110 would be easily filled with inner spacers and leave no voids therein, which is undesirable per the present disclosure.

In various embodiments, to create the gaps 110 with a rectangular or substantially rectangular profile, the operation 16 applies an etching process that is tuned selective to the material of the semiconductor layers 103b, and with no (or minimal) etching to the gate spacers 124, the hard mask layer 130, the isolation structure 104, and the semiconductor layers 103a. Various etching parameters can be tuned to achieve selective etching of the semiconductor layers 103b, such as etchant composition, etching temperature, etching solution concentration, etching time, etching pressure, source power, RF bias voltage, RF bias power, etchant flow rate, other suitable etching parameters, or combinations thereof. In the present embodiment, the operation 16 applies an isotropic dry etching process (such as a surface gas/radical reaction process) to the semiconductor layers 103b with a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103b which includes silicon germanium. In some embodiments, a ratio of the fluorine-containing gas to an oxygen-containing gas (for example, $O_2$), an etching temperature, and/or an RF power may be tuned to selectively etch silicon germanium or silicon. In the present embodiment, the operation 16 further applies a cleaning process to the surfaces exposed in the S/D trench 105 after the etching process finishes. The cleaning process may include applying a diluted hydrofluoric acid (d-HF) to the various surfaces. The profile of the gaps 110 discussed above is a collective result of the etching process and the cleaning process.

Figure 5:
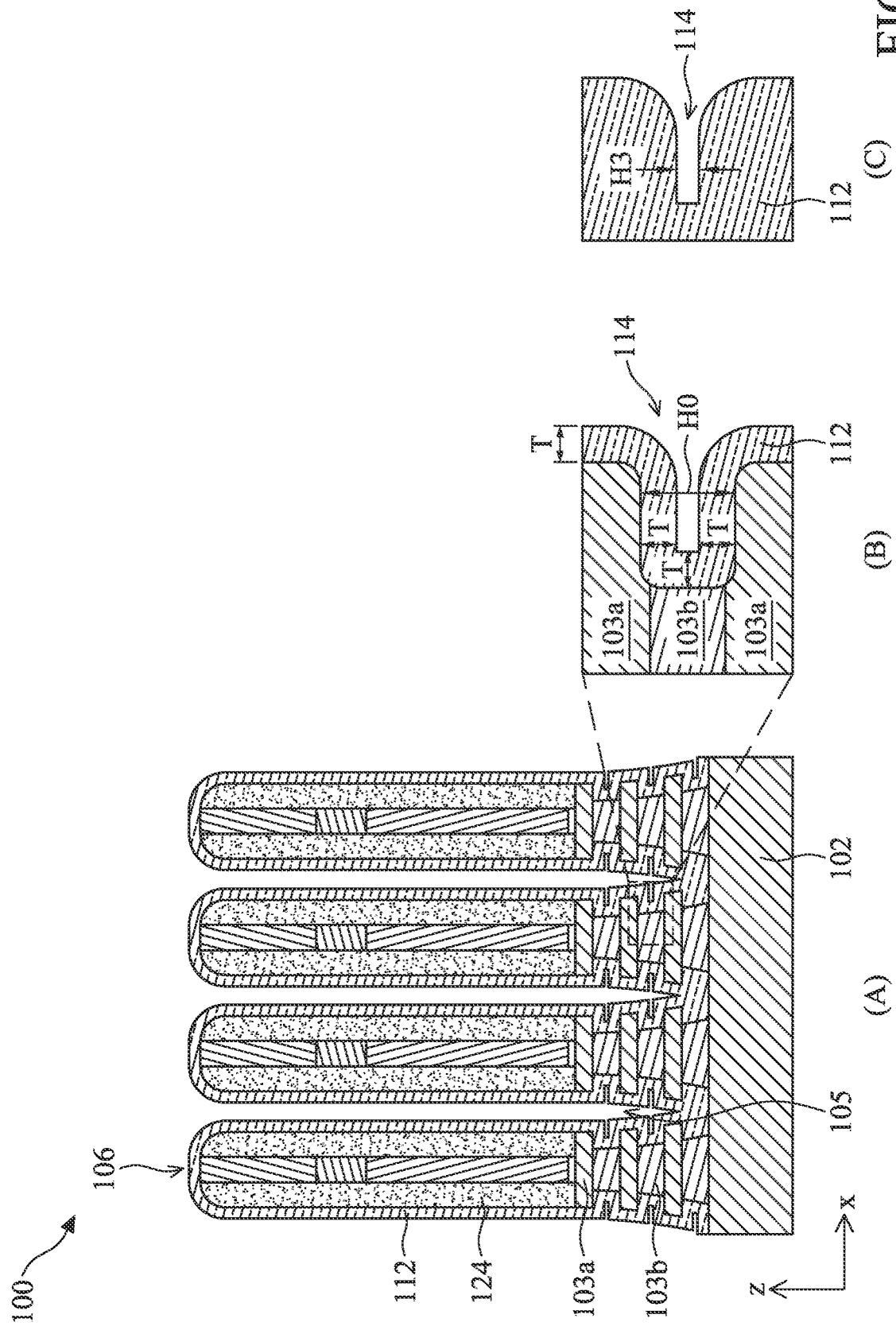

At operation 18, the method 10 (FIG. 1A) deposits a dielectric layer 112 along the various exposed surfaces of the device 100, such as shown in FIG. 5. Particularly, the dielectric layer 112 is deposited on the top surface of the sacrificial gate stacks 106, the sidewalls of the gate spacers 124, and the surfaces of the semiconductor layers 103a and 103b exposed in the S/D trenches 105. In various embodiments, the dielectric layer 112 may include a material that is different than materials in the semiconductor layers 103b and the gate spacers 124 to achieve desired etching selectivity during subsequent etching processes. In some embodiments, the dielectric layer 112 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the dielectric layer 112 includes a low-k dielectric material. Example low-k dielectric materials include fluoride-doped silica glass, carbon doped silicon oxide, Black Diamond® (Applied Materials of Santa Clara, California), Xerogel, Aerogel, amorphous fluorinated carbon, Parylene, Benzocyclobutene (BCB), SILK (Dow Chemical, Midland, Michigan), polyimide, other low-k dielectric material, or combinations thereof.

As illustrated in a blow-up fragmentary view in FIG. 5 (the part (b) of FIG. 5), the dielectric layer 112 is deposited to have a uniform or substantially uniform thickness T along the surfaces of the semiconductor layers 103a and 103b. In the present embodiment, the thickness T is designed to be less than one half of H0 (i.e., T<½*H0) so that the gap 110 is only partially filled by the dielectric layer 112, leaving a void (or an air gap) 114 vertically (along the "z" direction) between the two adjacent semiconductor layers 103a. Particularly, the void 114 is disposed vertically between the dielectric layer 112 on the two adjacent semiconductor layers 103a. Further, the void 114 extends into the middle section of the gap 110 of FIG. 4. As will be discussed later, the void 114 helps reduce the parasitic capacitance in high-k metal gates and/or S/D features of the device 100. To achieve the substantially uniform thickness T, the operation 18 in the present embodiment uses atomic layer deposition (ALD) techniques to deposit the dielectric layer 112. Using the ALD techniques, the operation 18 can control how many atomic layers are deposited, thus can control the total thickness T. The present disclosure contemplates using other deposition techniques to deposit the dielectric layer 112 to have a uniform or substantially uniform thickness T. In various embodiments, the thickness T may be in a range of about 3.0 nm to 6.0 nm such as about 3.5 nm to 5.5 nm. If T is too large (for example, more than 6.0 nm), it might completely fill the gap 110 in some embodiments and leave no void therein, which would undesirably increase the parasitic capacitance between the gate and the S/D features of the device 100. If T is too small (for example, less than 3.0 nm), the layer 112 might not be able to sustain an etching process in a subsequent channel release process (i.e., the etching process for removing the semiconductor layer 103b). As illustrated in a blow-up fragmentary view in FIG. 5 (the part (c) of FIG. 5), the void 114 is substantially rectangular in some embodiments. The height H3 of the void 114 (along the "z" direction) is (H0−2×T). In some embodiments, the height H3 is in a range of about 0.5 to 1.5 nm. In some embodiments, a ratio of H3 to T (H3:T) is designed by taking into account various factors such as an acceptable amount of coupling capacitance between gates and S/D features and etching resistance by the inner spacer 112 during gate replacement and channel release processes. Having a larger ratio of H3:T would generally lead to larger voids and smaller coupling capacitance, while having a smaller ratio of H3:T would generally lead to thicker inner spacer 112, greater etching resistance, and better protection for S/D features during gate replacement and channel release processes. In some embodiments, a ratio of H3 to T (H3:T) is designed to be in a range of 0.15 to 0.5 for the reasons stated above. If the ratio of H3:T is too small (such as less than 0.15), then the coupling capacitance between gates and S/D features might be unacceptably high in some instances. If the ratio of H3:T is too large (such as greater than 0.5), then the inner spacer 112 might be too thin to protect S/D features during gate replacement and channel release processes.

Figure 6:
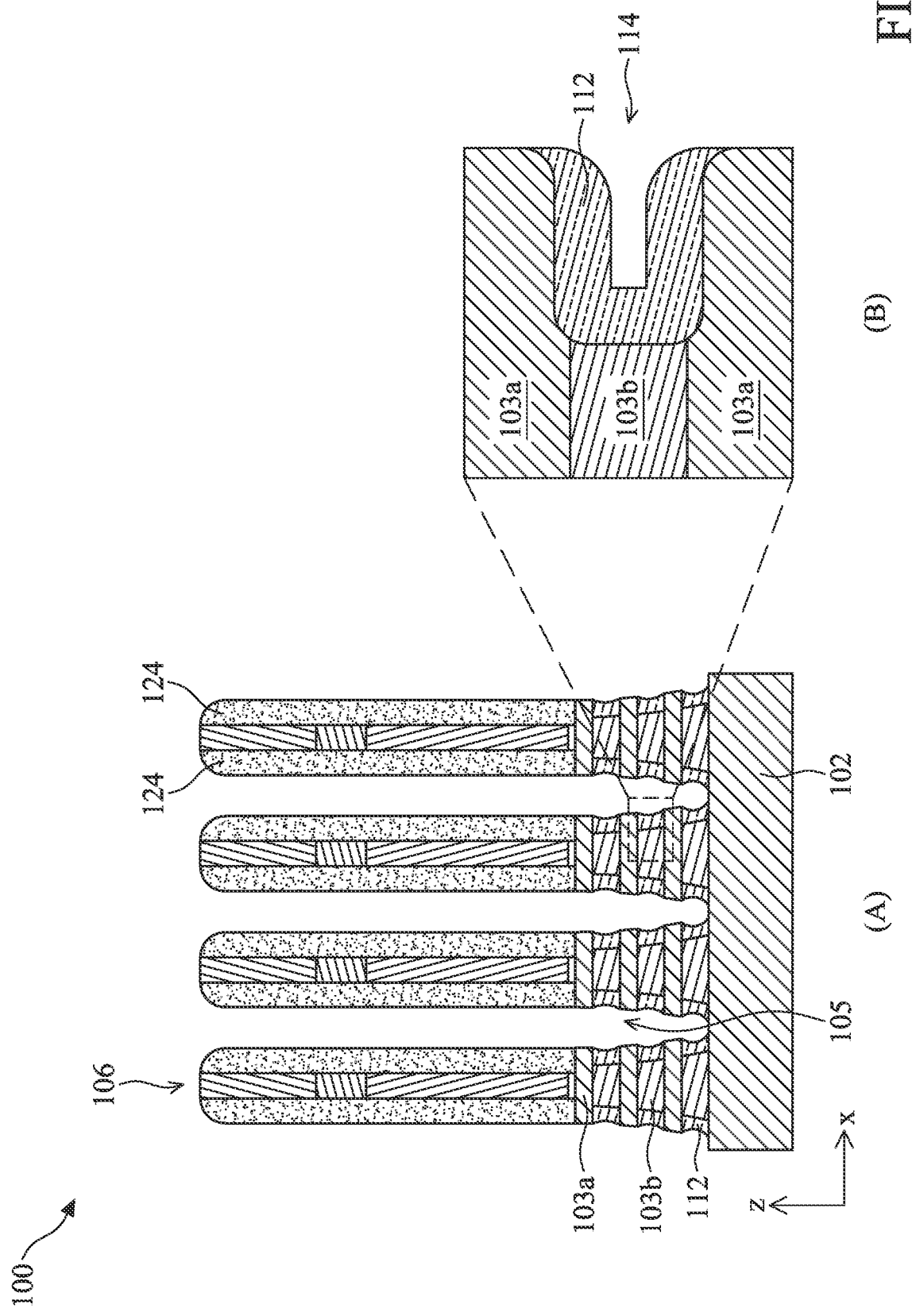

At operation 20, the method 10 (FIG. 1A) performs an etch-back process to the dielectric layer 112. The etch-back process partially removes the dielectric layer 112. Particularly, as illustrated in FIG. 6, the dielectric layer 112 is removed from the surfaces of the sacrificial gate stacks 106, the gate spacers 124, and the substrate 102. In the present embodiment, only portions of the dielectric layer 112 in the gap 110 (FIG. 4) still remain the device 100. The remaining portions of the dielectric layer 112 are referred to as an inner spacer 112 (or inner spacer features 112) of the device 100. Further, as illustrated in the fragmentary blow-up view in FIG. 6, the inner spacer features 112 partially fill the gap 110, and the void 114 remains disposed between the inner spacer features 112 on the two adjacent semiconductor layers 103a. In the depicted embodiment, the outer portion of the void 114 (i.e., the portion of the void 114 away from the semiconductor layer 103b) is enlarged (or encroached) by the etch-back process. In some embodiments, more than half of the length of the void 114 (along the "x" direction) may be enlarged by the etch-back process and etch post clean process. In some alternative embodiments, the outer portion of the void 114 is not enlarged. In various embodiments, the etch-back process may apply dry etching, wet etching, or reactive ion etching that is tuned selective to the material of the dielectric layer 112, and with minimal (to no) etching of the semiconductor layers 103a, the sacrificial gate stacks 106, and the gate spacers 124. For example, the etch-back process may apply an isotropic wet etching process. In view of the topography of the device 100, an isotropic wet etching process is effective in removing the dielectric layer 112 from the various surfaces other than those portions in the gap 110, as discussed above. As a result of the operation 20, surfaces of the semiconductor layers 103a and the substrate 102 are exposed in the S/D trenches 105.

Figure 7:
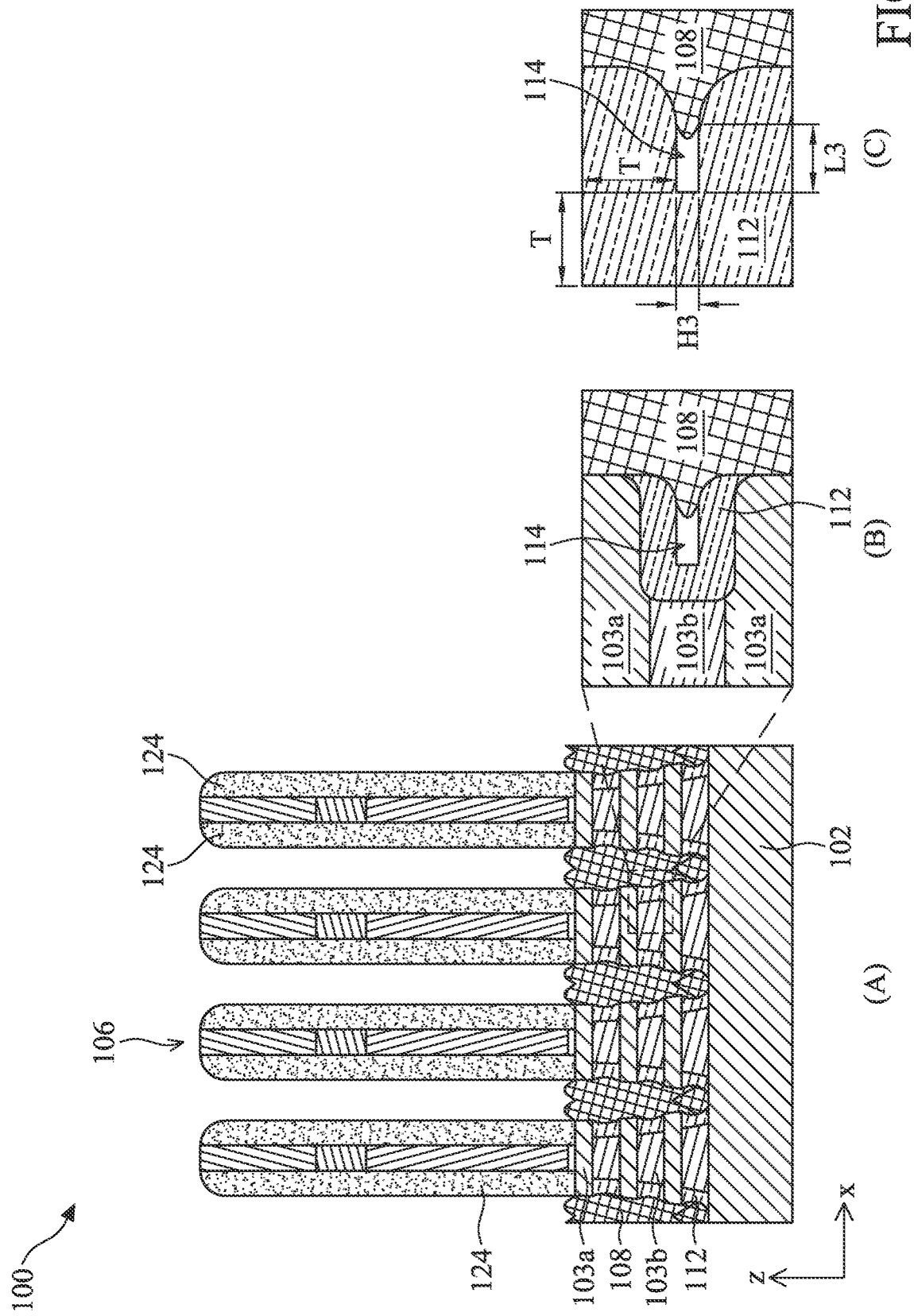

At operation 22, the method 10 (FIG. 1B) epitaxially grows source/drain (S/D) features 108 from the surfaces of the semiconductor layers 103a and the substrate 102 that are exposed in the S/D trenches 105, as illustrated in FIG. 7. An epitaxy process can use chemical vapor deposition (CVD) techniques (for example, vapor phase epitaxy and/or Ultra-High Vacuum CVD), molecular beam epitaxy, other suitable epitaxial growth processes, or combinations thereof. The epitaxy process can use gaseous and/or liquid precursors, which interact with the composition of the substrate 102 and the semiconductor layers 103a. The method 10 may also dope the epitaxial source/drain features 108 with n-type dopants and/or p-type dopants. In some embodiments, for n-type transistors, the epitaxial source/drain features 108 include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for p-type transistors, the epitaxial source/drain features 108 include silicon germanium or germanium, and can be doped with boron, other p-type dopant, or combinations thereof (for example, forming Si:Ge:B epitaxial source/drain features). In some embodiments, the epitaxial source/drain features 108 may include multiple epitaxial semiconductor layers where the multiple epitaxial semiconductor layers have different levels of dopant density. Further, the doping can be in-situ (i.e., doped during deposition by adding impurities to a source material of the epitaxy process) or ex-situ (e.g., doped by an ion implantation process subsequent to a deposition process). In some embodiments, annealing processes (e.g., rapid thermal annealing (RTA) and/or laser annealing) are performed to activate dopants in the epitaxial source/drain features 108. In the present embodiment, the epitaxial S/D features 108 may partially fill the voids 114. However, at least some portion of the voids 114 remain. FIG. 7 illustrates a cross-sectional view of the device 100 at this fabrication stage in part (a), a blow-up view of the layers 103a, 103b, 112, and 108 in part (b), and a further blow-up view of the layer 112 and the S/D feature 108 surrounding the void 114 in part (c). As illustrated in part (c) of FIG. 7, a portion of the void 114 remains in the device 100 and is surrounded by the inner spacer features 112 on three sides and the epitaxial S/D feature 108 on one side. Also, an outer portion of the void 114 (i.e., the portion that is away from the semiconductor layer 103b) has been filled by the epitaxial S/D feature 108 in this embodiment. The remaining portion of the void 114 has a length L3 along the "x" direction and a height H3 along the "z" direction. The remaining portion of the void 114 is substantially rectangular in the present embodiment, and may be circular or irregular in alternative embodiments. The height H3 is discussed with reference to FIG. 5 and may be in the range of about 0.5 to 1.5 nm in some embodiments. In some embodiments, a ratio of H3 to T (H3:T) is designed to be in a range of 0.15 to 0.5 as discussed above. The length L3 is determined by the length L1 (see FIG. 4 and the associated texts), the thickness T (see FIG. 5 and the associated texts), and the encroachment by the S/D feature 108 into the void 114. In some embodiments, the length L3 may be in the range of 0.5 nm to 3 nm. In some embodiments, the ratio of L3 to T may be in the range of 0.1 to 1.0. If the ratio of L3:T is too small (such as less than 0.1), then the void 114 might be relatively too small (compared with the size of the inner spacer 112) and the coupling capacitance between gates and S/D features 108 might be unacceptably high in some instances. If the ratio of L3:T is too large (such as greater than 1.0), then the inner spacer 112 might be too thin to protect S/D features 108 during gate replacement and channel release processes. The volume of the void 114 is a function of the height H3 and the length L3. If the H3 and L3 are too small (such as less than their respective lower end values discussed above), the volume of the void 114 might be too small to effectuate noticeable reduction in the parasitic capacitance in some instances. The upper end values of the height H3 and the length L3 (such as 1.5 nm and 3 nm respectively) are generally limited by the dimensions of the layers 103b and the layer 112 and the encroachment by the S/D feature 108.

Figure 8:
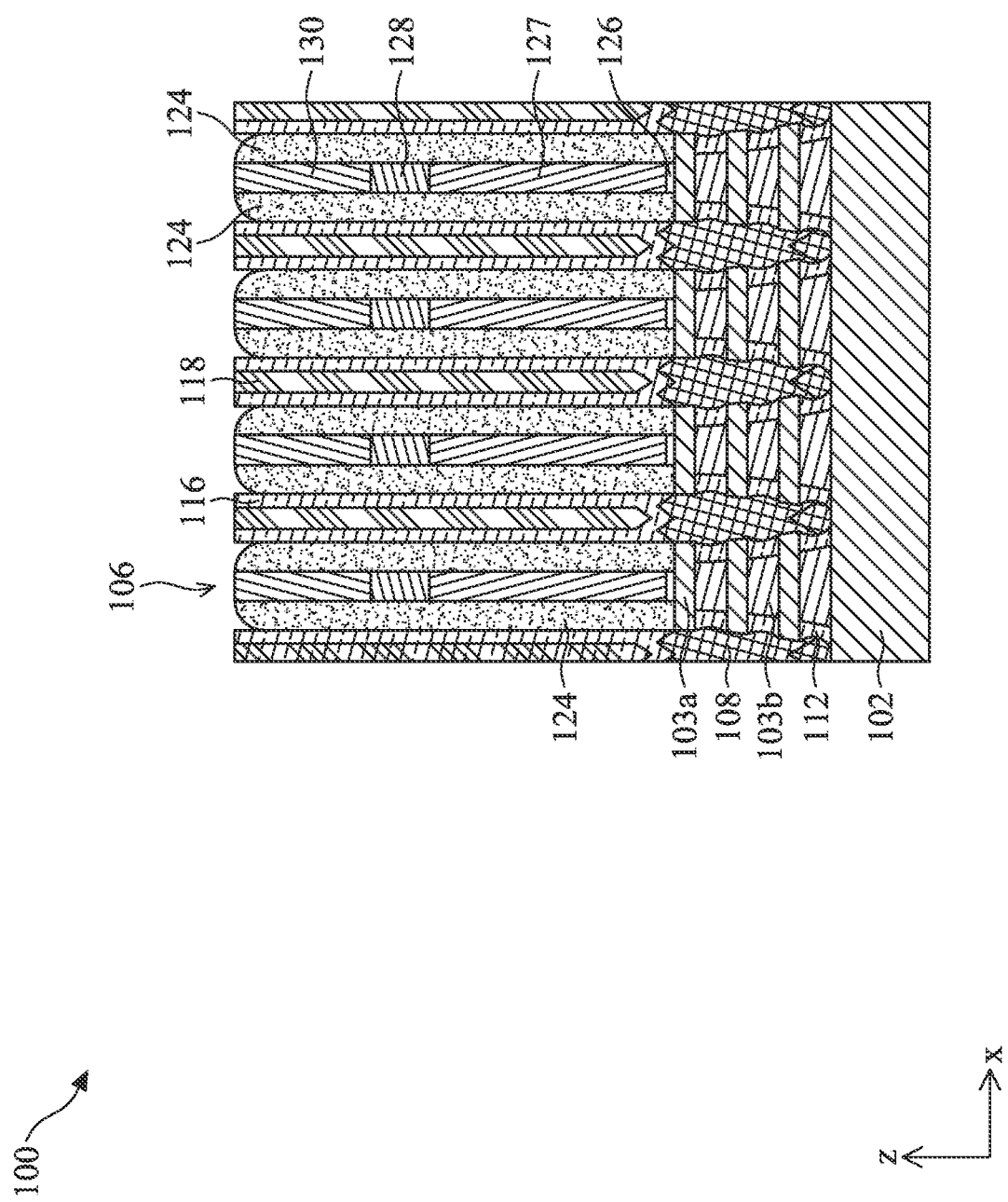

At operation 24, the method 10 (FIG. 1B) forms a contact etch stop layer (CESL) 116 and an inter-level dielectric (ILD) layer 118 over the device 100 (FIG. 8). As illustrated in FIG. 8, the CESL 116 is formed over the S/D features 108, the sacrificial gate stacks 106, and the sidewalls of the gate spacers 124. The ILD layer 118 is deposited over the CESL 116. The CESL 116 may comprise silicon nitride, silicon oxynitride, silicon nitride with oxygen (O) or carbon (C) elements, and/or other materials; and may be formed by CVD, PVD, ALD, or other suitable methods. In an embodiment, the CESL 116 is deposited to a substantially uniform thickness along the various surfaces discussed above. The ILD layer 118 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 118 may be formed by PECVD (plasma enhanced CVD), FCVD (flowable CVD), or other suitable methods. The ILD layer 118 fills the various trenches between the sacrificial gate stacks 106 and between the S/D features 108.

Figure 9:
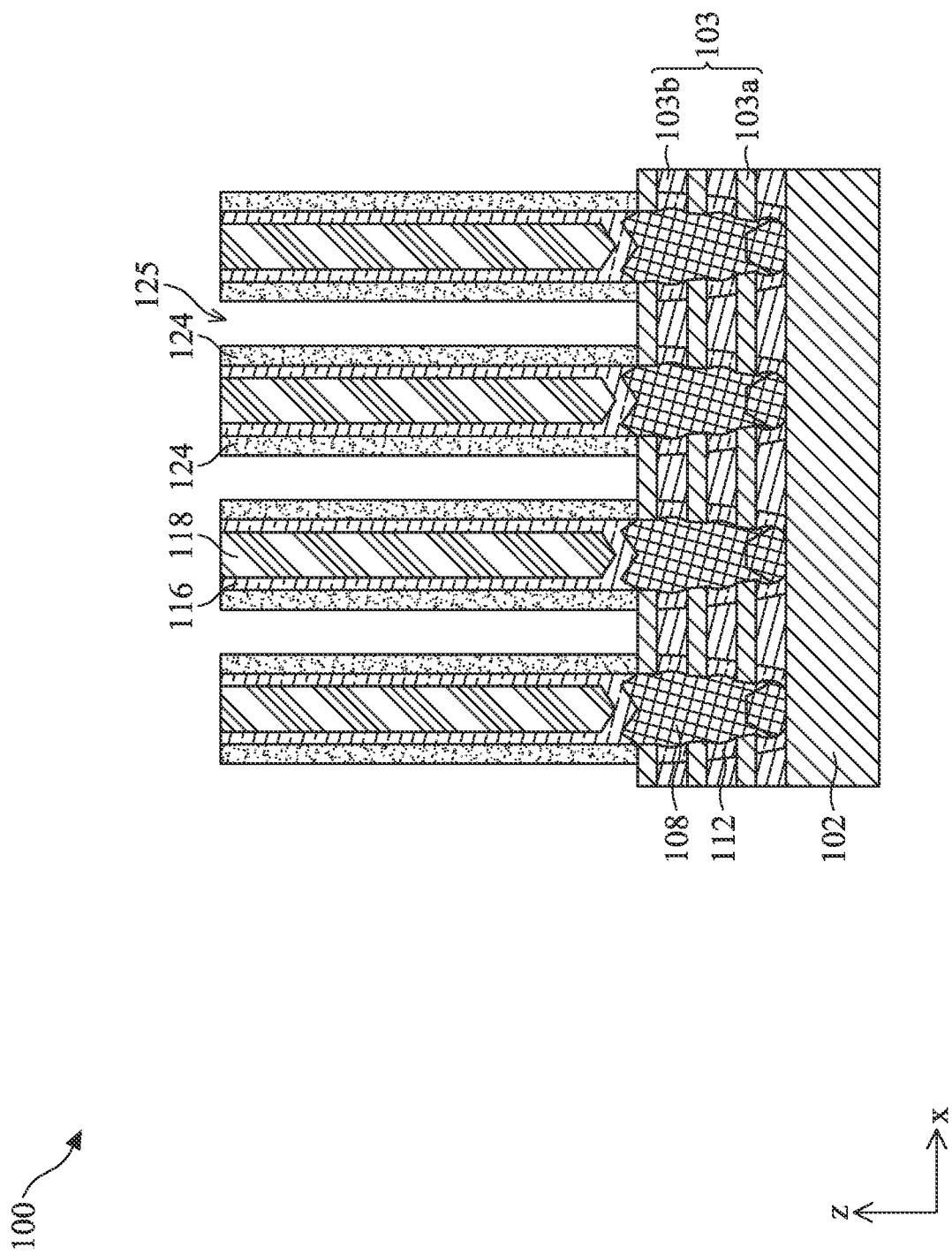

At operation 26, the method 10 (FIG. 1B) removes the sacrificial gate stacks 106 from the device 100, thereby forming gate trenches 125 (FIG. 9). In an embodiment, the operation 26 may perform a CMP process to the device 100 to expose a top surface of the sacrificial gate stacks 106. Then, the operation 24 performs one or more etching process to remove the sacrificial gate stacks 106, including the hard mask layers 128 and 130, the sacrificial gate electrode layer 127, and the sacrificial gate dielectric layer 126 as shown in FIG. 8. The etching process may include dry etching, wet etching, reactive ion etching, combinations thereof, or other suitable etching processes. The etching process is tuned selective to the materials of the sacrificial gate stacks 106, with no (or minimal) etching to the ILD layer 118, the CESL 116, the gate spacers 124, and the fins 103 (including the semiconductor layers 103a and 103b). As depicted in FIG. 9, the etching process results in gate trenches 125 between two opposing gate spacers 124. The gate trenches 125 expose channel regions of the fins 103.

Figure 10:
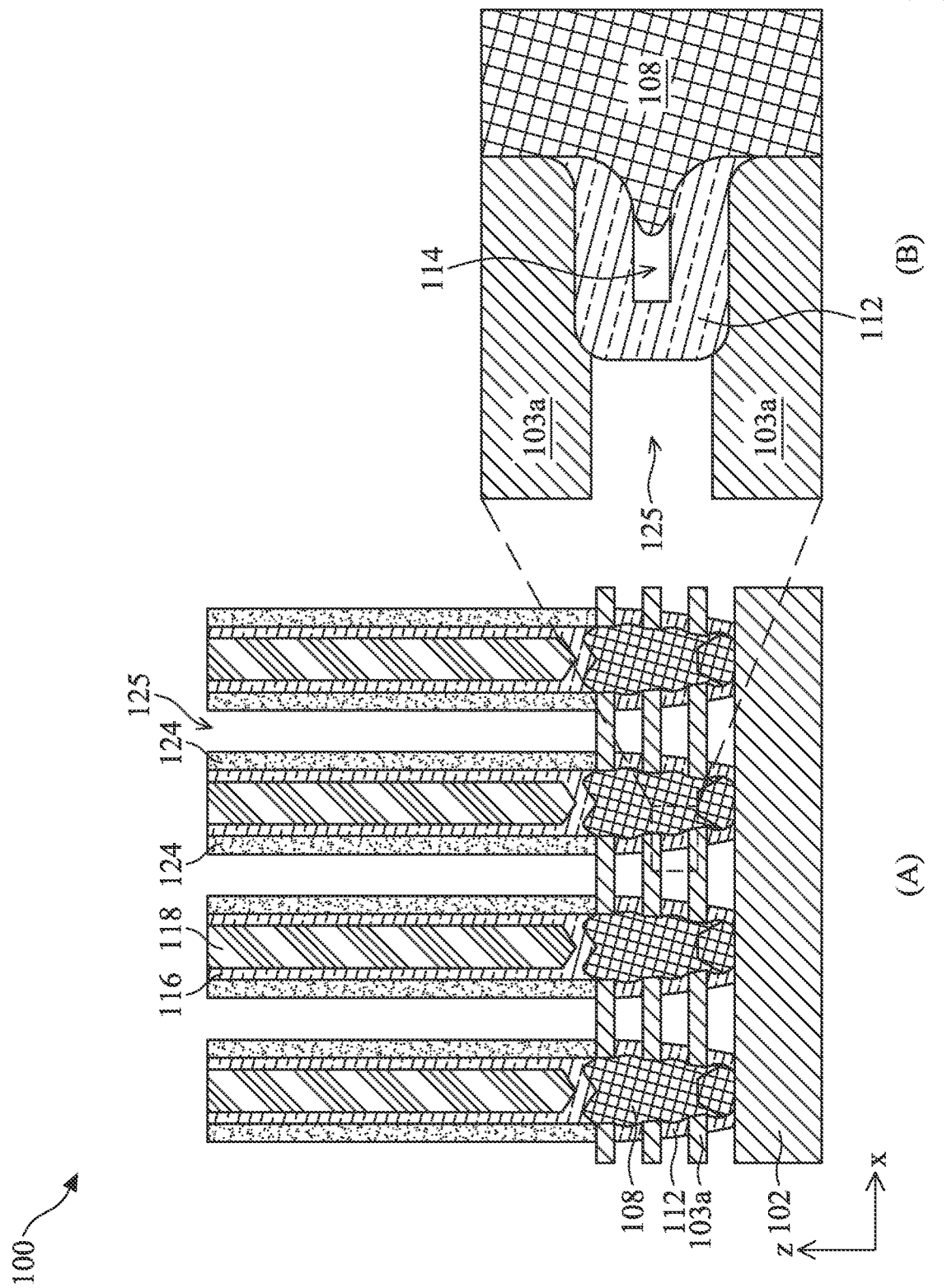

At operation 28, the method 10 (FIG. 1B) selectively removes the semiconductor layers 103b from the gate trenches 125 (FIG. 10). This process is also referred to as a channel release process in some embodiments. In the embodiment depicted in FIG. 10, an etching process selectively etches the semiconductor layers 103b with minimal (to no) etching of the semiconductor layers 103a and, in some embodiments, minimal (to no) etching of the gate spacers 124 and/or the inner spacer features 112. Various etching parameters can be tuned to achieve selective etching of the semiconductor layers 103b, such as etchant composition, etching temperature, etching solution concentration, etching time, etching pressure, source power, RF bias voltage, RF bias power, etchant flow rate, other suitable etching parameters, or combinations thereof. The etching process can be a dry etching process, a wet etching process, other suitable etching process, or combinations thereof. In some embodiments, a dry etching process (such as a surface gas/radical reaction process) utilizes a fluorine-containing gas (for example, HF, $F_2$, $NF_3$, $CF_4$, $SF_6$, $CH_2F_2$, $CHF_3$, and/or $C_2F_6$) to selectively etch the semiconductor layers 103b which include silicon germanium. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch the semiconductor layers 103b. In some embodiments, a chemical vapor phase etching process using hydrochloric acid (HCl) selectively etches the semiconductor layers 103b. Because of the etch selectivity, the inner spacer features 112 protects the S/D features 108 from the etching process. As illustrated in the fragmentary blow-up view in FIG. 10, in the present embodiment, one side of the inner spacer feature 112 is exposed in the gate trench 125. The other side of the inner spacer feature 112 is in direct contact with the S/D feature 108. The inner spacer feature 112 and the S/D feature 108 surround the void 114.

As a result of the operation 28, the semiconductor layers 103a are suspended over the substrate 102 and connecting the S/D features 108 on opposing sides of each gate trench 125. In some embodiments, after removing the semiconductor layers 103b, an etching process is performed to modify a profile of the semiconductor layers 103a to achieve desired dimensions and/or desired shapes (e.g., cylindrical-shaped (e.g., nanowire), rectangular-shaped (e.g., nanobar), sheet-shaped (e.g., nanosheet), etc.). The present disclosure further contemplates embodiments where the semiconductor layers 103a have sub-nanometer dimensions depending on design requirements of the device 100.

Figure 11:
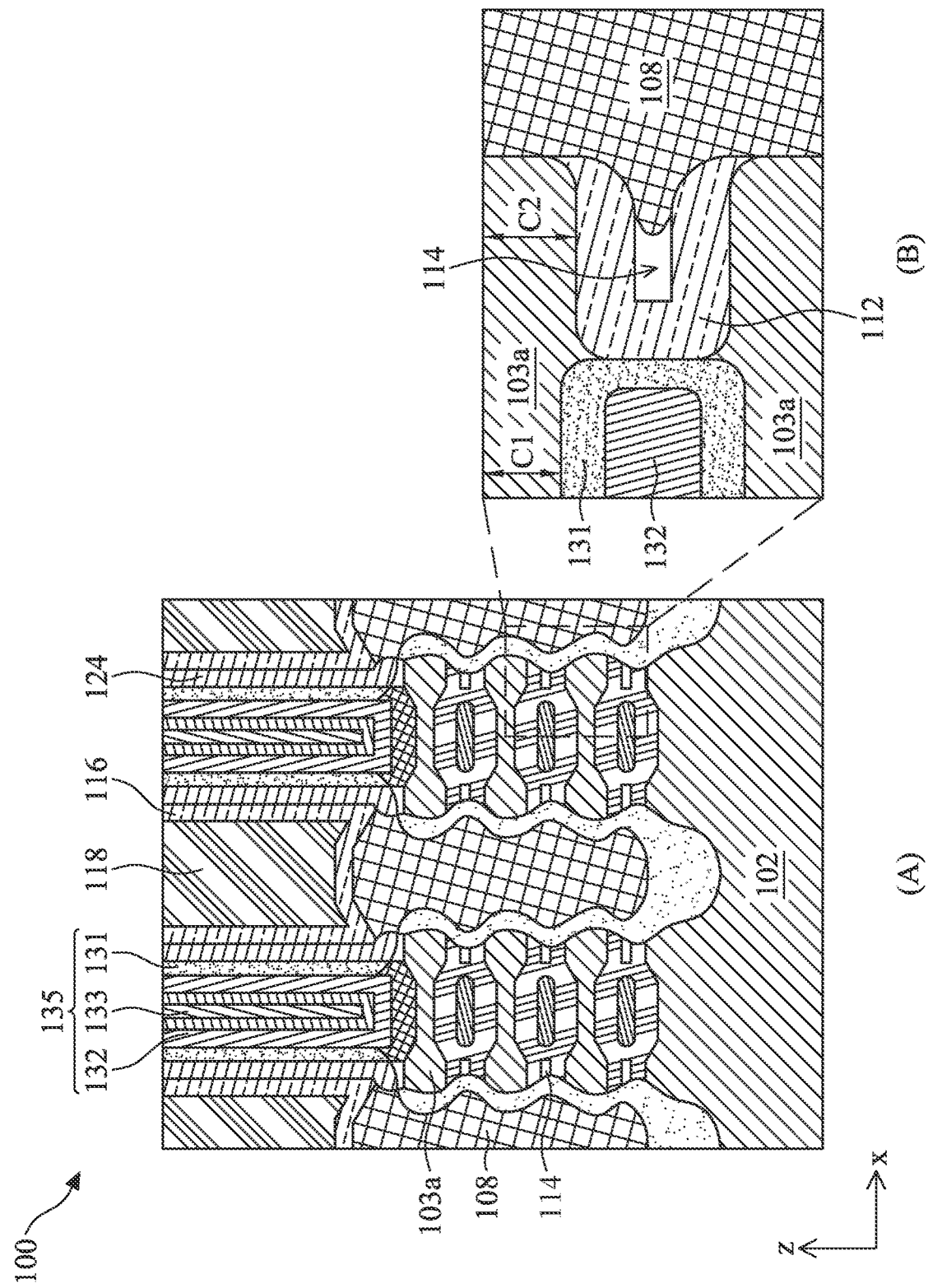

At operation 30, the method 10 (FIG. 1B) forms high-k metal gate stacks (HKMG) 135 in the gate trenches 125, surrounding each of the semiconductor layers 103a (FIG. 11). In an embodiment, the HKMG 135 includes a gate dielectric layer 131, a work function metal layer 132 over the gate dielectric layer 131, and a metal fill layer 133 over the work function metal layer 132. The gate dielectric layer 131 may include a high-k dielectric material such as hafnium oxide, zirconium oxide, lanthanum oxide, titanium oxide, yttrium oxide, and strontium titanate. The gate dielectric layer 131 may be formed by chemical oxidation, thermal oxidation, atomic layer deposition (ALD), chemical vapor deposition (CVD), and/or other suitable methods. In some embodiments, the HKMG 135 further includes an interfacial layer between the gate dielectric layer 131 and the semiconductor layers 103a. The interfacial layer may include silicon oxide, silicon oxynitride, or other suitable materials. In some embodiments, the work function metal layer 132 includes an n-type or a p-type work function layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. The work function metal layer 132 may be formed by CVD, PVD, ALD, and/or other suitable processes. In embodiments, the metal fill layer 133 may include aluminum, tungsten, cobalt, copper, and/or other suitable materials, and may be formed by CVD, PVD, plating, and/or other suitable processes.

As illustrated in the fragmentary blow-up view in FIG. 11, in this embodiment, the gate dielectric layer 131 is disposed between two adjacent layers of the semiconductor layers 103a and in direct contact with the inner spacer feature 112, and the work function metal layer 132 is disposed next to the gate dielectric layer 131. In some embodiments, there may be additional layer(s) between the gate dielectric layer 131 and the work function metal layer 132, and/or additional layer(s) surrounded by the work function metal layer 132. In embodiments where the HKMG 135 includes an interfacial layer as discussed earlier, the interfacial layer is disposed between the gate dielectric layer 131 and the inner spacer feature 112 (i.e., the interfacial layer is disposed in direct contact with the inner spacer feature 112 and the two adjacent layers of the semiconductor layers 103a). The semiconductor layers 103a directly above or below the gate dielectric layer 131 (along the "z" direction) has a thickness c1. The semiconductor layers 103a directly above or below the inner spacer feature 112 (along the "z" direction) has a thickness c2. In various embodiments, c1 may be the same as or different from c2. Further, the inner spacer feature 112, other than its portion in direct contact with the S/D feature 108, has a substantially uniform thickness along surfaces of the two adjacent layers of the semiconductor layers 103a. The void (or air gap) 114 is surrounded by the inner spacer feature 112 and the S/D feature 108. Since air has a low dielectric constant (k=1), having the void 114 reduces the parasitic capacitance of the HKMG 135 and/or the S/D features 108, thereby increasing the operating speed of the device 100. At the same time, the materials of the inner spacer 112 can be selected to offer higher etch selectivity for protecting the S/D features 108 during the channel release process (see operation 28). Even if its dielectric constant is slightly higher than an alternative material (but with lower etch selectivity), the voids 114 can compensate for the difference in the dielectric constants.

At operation 32, the method 10 (FIG. 1B) performs further fabrication steps to the device 100. For example, the method 10 may etch the ILD layer 118 and the CESL 116 in the S/D regions of the device 100 to form contact holes exposing the S/D features 108, form silicide features on the S/D features 108, form S/D contacts over the silicide features, form gate contacts connecting to the HKMG 135, and form interconnect layers.

Although not intended to be limiting, embodiments of the present disclosure provide one or more of the following advantages. First, embodiments of the present disclosure provide voids between inner spacers and S/D epitaxial features. This can reduce the parasitic capacitance of the gate electrodes and S/D electrodes, thereby increasing a device's operating speed. Second, embodiments of the present disclosure provide methods for tuning the size of the voids, for example, by controlling the thicknesses of the semiconductor layers (e.g., silicon layers and silicon germanium layers) in a fin stack, controlling the process conditions for recessing the semiconductor layers, and controlling the process conditions for depositing the inner spacer dielectric layer. Third, the inner spacer material can be selected to provide low etching rate during the channel release process, thereby protecting the source/drain epitaxial features from etching loss. Fourth, embodiments of the present disclosure can be readily integrated with existing semiconductor manufacturing processes.

In one example aspect, the present disclosure is directed to a method that includes providing a structure having a substrate and a fin, the fin having first layers of a first semiconductor material and second layers of a second semiconductor material different from the first semiconductor material, wherein the first layers and the second layers are alternately stacked over the substrate, the structure further having a sacrificial gate stack engaging a channel region of the fin and gate spacers on sidewalls of the sacrificial gate stack. The method further includes etching a source/drain (S/D) region of the fin, resulting in an S/D trench; partially recessing the second layers exposed in the S/D trench, resulting in a gap between two adjacent layers of the first layers; and depositing a dielectric layer over surfaces of the gate spacers, the first layers, and the second layers, wherein the dielectric layer partially fills the gap, leaving a void sandwiched between the dielectric layer on the two adjacent layers of the first layers.

In an embodiment, the method further includes performing an etching back process to the dielectric layer, thereby exposing portions of the first layers in the S/D trench, wherein a portion of the void remains sandwiched between the dielectric layer on the two adjacent layers of the first layers. In a further embodiment, the method includes epitaxially growing a third semiconductor material from the portions of the first layers exposed in the S/D trench, wherein the portion of the void remains sandwiched between the dielectric layer on the two adjacent layers of the first layers. In some further embodiment of the method, the void is surrounded by the dielectric layer and the third semiconductor material. The method may further includes removing the sacrificial gate stack, resulting in a gate trench and removing the second layers from the gate trench, thereby exposing the dielectric layer in the gate trench. The method may further includes forming a high-k metal gate stack in the gate trench.

In some embodiment of the method, the partially recessing the second layers includes an isotropic dry etching process that is selective to the second semiconductor material. In some embodiment, the partially recessing the second layers further includes applying a cleaning process using diluted hydrofluoric acid after the isotropic dry etching process finishes. In some embodiment of the method, the dielectric layer is deposited using atomic layer deposition.

In another example aspect, the present disclosure is directed to a method that includes providing a structure having a substrate and a fin, the fin having first layers and second layers alternately stacked, wherein the first layers include a first semiconductor material and the second layers include a second semiconductor material different from the first semiconductor material. The method further includes etching a source/drain (S/D) region of the fin, resulting in an S/D trench; partially recessing the second layers exposed in the S/D trench using an isotropic dry etching process, resulting in at least a gap between two adjacent layers of the first layers; depositing a dielectric layer over surfaces of the first layers and the second layers, wherein the dielectric layer partially fills the gap, leaving a void between two portions of the dielectric layer on the two adjacent layers of the first layers; etching back the dielectric layer, thereby exposing surfaces of the first layers in the S/D trench; and epitaxially growing a third semiconductor material from at least the surfaces of the first layers exposed in the S/D trench, wherein the void remains between two portions of the dielectric layer on the two adjacent layers of the first layers.

In some embodiment of the method, the dielectric layer includes a low-k material, silicon oxide, silicon nitride, silicon oxynitride, silicon carbide, or silicon oxycarbide, or silicon oxycarbonitride. In some embodiment, the dielectric layer is deposited using atomic layer deposition and a thickness of the dielectric layer is controlled to be less than half of a thickness of the second layers.

In some embodiment, the method further includes cleaning the gap using diluted hydrofluoric acid before depositing the dielectric layer into the gap. In some embodiment where the structure further includes a sacrificial gate stack engaging a channel region of the fin and gate spacers on sidewalls of the sacrificial gate stack, the method further includes, after the epitaxially growing of the third semiconductor material, removing the sacrificial gate stack and resulting in a gate trench; removing the second layers from the gate trench, thereby exposing the dielectric layer in the gate trench; and forming a high-k metal gate stack in the gate trench, wherein the dielectric layer and the void are disposed between the high-k metal gate stack and the third semiconductor material. In some embodiment of the method, the partially recessing of the second layers results in a loss of a thickness of the first layers above the gap and the loss is less than 1.5 nm.

In yet another example aspect, the present disclosure is directed to a device that includes a substrate, two source/drain (S/D) features over the substrate; semiconductor layers suspended over the substrate and connecting the two S/D features; a first dielectric layer disposed between two adjacent layers of the semiconductor layers; and an air gap between the dielectric layer and one of the S/D features.

In some embodiment of the device, the air gap is surrounded by the first dielectric layer and the one of the S/D features. In some embodiment, the first dielectric layer has a substantially uniform thickness along surfaces of the two adjacent layers of the semiconductor layers.

In some embodiment, the device further includes a high-k dielectric layer between the two adjacent layers of the semiconductor layers, wherein the first dielectric layer and the air gap are disposed between the one of the S/D features and the high-k dielectric layer. In a further embodiment, the device includes a gate metal layer between the two adjacent layers of the semiconductor layers, wherein the high-k dielectric layer is disposed between the first dielectric layer and the gate metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first semiconductive layer disposed over a substrate;
a dielectric layer disposed over the first semiconductive layer, wherein the dielectric layer defines a lateral recess in a cross-sectional side view;
a portion of a gate structure disposed over the first semiconductive layer, wherein a side surface of the portion of the gate structure extends to a side surface of the dielectric layer;
a second semiconductive layer disposed over the dielectric layer; and
a source/drain component that partially protrudes into the lateral recess;
wherein the first semiconductive layer, the dielectric layer, the second semiconductive layer, and the source/drain component are portions of a gate-all-around (GAA) transistor.

2. The device of claim 1, wherein the lateral recess is filled by air.

3. The device of claim 1, wherein in the cross-sectional side view, a profile of the dielectric layer resembles a letter "U" that is rotated by 90 degrees.

4. The device of claim 1, wherein:
the dielectric layer has a width; and
the lateral recess has a maximum lateral dimension that is less than the width of the dielectric layer.

5. The device of claim 1, wherein the portion of the gate structure is disposed between the first semiconductive layer and the second semiconductive layer.

6. The device of claim 5, wherein:
the gate structure includes a gate spacer; and
the gate spacer and the dielectric layer have different material compositions.

7. The device of claim 5, wherein a portion of the source/drain component that partially protrudes into the lateral recess has a rounded tip in a cross-sectional side view.

8. The device of claim 1, wherein:
the portion of the gate structure includes a work function metal layer and a gate dielectric layer that surrounds the work function metal layer in the cross-sectional side view; and
a side surface of the gate dielectric layer is in direct physical contact with the side surface of the dielectric layer.

9. The device of claim 8, wherein:
an upper surface of the gate dielectric layer of the portion of the gate structure has a more vertically elevated position than an upper surface of the dielectric layer; or
a lower surface of the gate dielectric layer of the portion of the gate structure has a less vertically elevated position than a lower surface of the dielectric layer.

10. The device of claim 8, wherein a vertical dimension of the work function metal layer of the portion of the gate structure is greater than a vertical dimension of the lateral recess defined by the dielectric layer.

11. A device, comprising:
a stack of semiconductive layers disposed over a substrate;
a source/drain region disposed over the substrate and laterally adjacent to the stack of semiconductor layers;
an air gap disposed between at least some of the semiconductor layers, wherein a portion of the source/drain region protrudes partially into the air gap laterally; and
a gate structure, wherein the air gap is disposed between a portion of the gate structure and the source/drain region in a cross-sectional side view.

12. The device of claim 11, further comprising a gate spacer layer, wherein boundaries of the air gap are defined collectively by the gate spacer layer and by the portion of the source/drain region.

13. The device of claim 12, wherein the portion of the gate structure and the source/drain region are disposed on opposite sides of the gate spacer layer laterally.

14. The device of claim 12, wherein:
the portion of the gate structure includes a work function metal layer and a gate dielectric layer;
the gate dielectric layer is disposed between the work function metal layer and the gate spacer layer; and
the gate dielectric layer is in direct physical contact with the gate spacer layer.

15. The device of claim 14, wherein the gate dielectric layer and the gate spacer layer have different material compositions.

16. The device of claim 14, wherein a distance between a top surface of the portion of the gate structure and a bottom surface of the portion of the gate structure is greater than a distance between a top surface of the gate spacer layer and a bottom surface of the gate spacer layer.

17. A device, comprising:
a vertical stack of channel layers, wherein the vertical stack of channel layers includes at least a first channel layer and a second channel layer;

a portion of a gate structure located between the first channel layer and the second channel layer;

a source/drain located horizontally adjacent to the vertical stack of channel layers;

a first dielectric layer disposed vertically between the first channel layer and the second channel layer and horizontally between the portion of the gate structure and the source/drain; and a void embedded within the first dielectric layer, wherein the source/drain protrudes horizontally into the void.

18. The device of claim 17, wherein the portion of the gate structure includes a gate dielectric layer that is in direct contact with the first dielectric layer, and wherein the gate dielectric layer and the first dielectric layer have different material compositions.

19. The device of claim 17, wherein the gate structure includes a work function metal layer, and wherein a vertical dimension of the work function metal layer is greater than a vertical dimension of the void.

20. The device of claim 17, wherein the gate structure further includes a gate spacer, and wherein the gate spacer and the first dielectric layer have different material compositions.

* * * * *